United States Patent [19]

Kiriu et al.

[11] Patent Number: 4,692,922
[45] Date of Patent: Sep. 8, 1987

[54] METHOD FOR CORRECTING AND DETECTING ERRORS

[75] Inventors: Yoshio Kiriu; Shigeru Kaneko; Hiroshi Kosuge, all of Hadano, Japan

[73] Assignee: Hitachi, Ltd., Tokyo, Japan

[21] Appl. No.: 807,682

[22] Filed: Dec. 11, 1985

[30] Foreign Application Priority Data

Dec. 12, 1984 [JP] Japan ............................... 59-260709

[51] Int. Cl.$^4$ .............................................. G06F 11/10
[52] U.S. Cl. ............................................ 371/37; 371/38
[58] Field of Search ........................ 371/37, 38, 39, 40

[56] References Cited

U.S. PATENT DOCUMENTS 4,168,486  9/1979  Legory ................................. 371/37
4,241,446  12/1980  Trubisky ............................. 371/37
4,538,270  8/1985  Goodrich, Jr. et al. ............. 371/37

Primary Examiner—Charles E. Atkinson
Attorney, Agent, or Firm—Antonelli, Terry & Wands

[57] ABSTRACT

A method for correcting and detecting errors using the SEC-DED-SbED code is provided, wherein the information consisting of several blocks of b bits is encoded based on the parity matrix including any of b×b matrix X q (q=1 to b) in which each row of b×b matrix $$\begin{bmatrix} 1 & 1 & 1 & \cdots & 1 \\ & 1 & & & \\ & & 1 & & \\ & & & & \\ & & & & 1 \end{bmatrix}$$

is cyclically displaced along the column direction by a desired number (q) of bits in each partial matrix corresponding to the above block.

12 Claims, 17 Drawing Figures

EXPANDED PART

EXPANDED PART

METHOD FOR CORRECTING AND DETECTING ERRORS

BACKGROUND OF THE INVENTION

The present invention relates to a method for correcting and detecting errors, and is particularly concerned with a single error correcting, double error detecting, and single b bit block error detecting method which is suitable for the expansion of coded data length and large scale integration (LSI).

In a conventional storage using IC memories, IC memories in which input and output data of single bit configuration is stored have been mostly used to reduce the pin number of the IC memory package and increase the packaging density. However, in accordance with the development of the technique for highly integrated IC memories, use of IC memories in which input and output data consisting of several (b) bits is increasing. In such an IC memory of b bit configuration, an error may occur in the block of b bits which is output from the IC memory in case of an IC memory failure. Even in conventional IC memory of single bit configuration, an error may also occur when the driver which drives b number of IC memories in common is out of order and when the driver IC and the receiver IC of b bit configuration which drives and receives the input and output of the IC memory, respectively, are out of order.

Therefore, a method for correcting and detecting errors using the SEC-DED-SbED code (Single Error Correcting-Double Error Detecting-Single b bit byte Error Detecting Code) has been proposed which has the capability to correct single error, detect double error, and detect an error of three bits or more in a single b bit block.

As conventional methods for correcting and detecting errors, methods have been proposed:

(1) the method using the code which uses the $b \times b$ matrix, in which the $b \times b$ unit matrix is cyclically displaced along the column direction, as shown in the Japanese patent application publication No. 20142 of 1984;

(2) the method using the code described in the thesis titled "Byte error detecting code for semiconductor storage device" by Kaneda in the Electronic Communication Society Journal Vol. J 67 to D No. 5 (May, 1984) and (3) the method using the code described in the thesis titled "Error-Correcting Codes for Semiconductor Memory Applications: A State-of-the-Art Review" (p. 129) by C. L. Chen and M. Y. Hsiao in the IMB J. Res. Develop., Vol. 28, No. 2 (March, 1984).

However, in these methods for correcting and detecting errors, the expansion of coded data length is not taken into consideration by using the general-purpose encoding and decoding LSI, for example, by constituting each coding and decoding circuit for different information having the data length of 2 bytes, 4 bytes, and 8 bytes, respectively.

According to the method mentioned above in (1), when the number of cyclic displacement in terms of the $b \times b$ unit matrix is S, the check bit number $\gamma$ is limited as follows:

$$\gamma = S \cdot b (s \geq 2)$$

Therefore, the method was inadequate for correcting and detecting errors using the same check bit number $\gamma$ as that used in the conventional method using the SEC-DED code for each information having a data length of 2 bytes, 4 bytes, and 8 bytes, 2-byte data length: $\gamma = 6$ 4-byte data length: $\gamma = 7$ 8-byte data length: $\gamma = 8$, for example, a method for correcting and detecting errors using the SEC-DED-SbED code of b=4.

Figure 14A:
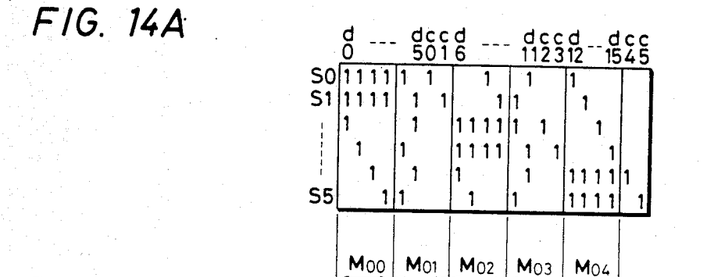
FIGS. 14A and 14B show an example of the parity matrix used in a conventional method for correcting and detecting errors, respectively.
Figure 14B:
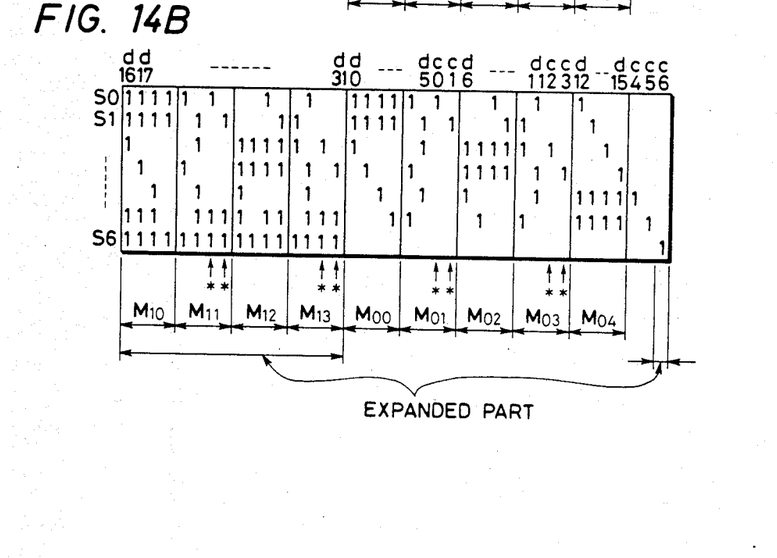

In the method mentioned in (2) there is an advantage that the data length can be expanded in this method compared with the other methods having the same check bit number, $\gamma$. However, the SEC-DED-SbED code parity matrix is in such a form that the check bits are not centralized in a specific block and that they co-exist together with data bits in a same block. Consequently, the configuration of the coding and decoding circuits becomes complex when the coded data length is expanded. FIGS. 14A and 14B show an example of a parity matrix of 2-byte data length of b=4 (coded data length n=22 bits, data bit number K=16 bits) and an example of a parity matrix of 4-byte data length of b=4 (n=29, K=32), respectively. In these figures, S0 to S6 denote a syndrome, C0 to C6 denote check bits, and d0 to d31 denote data bits. The partial matrices, M0j and M1j, have a similar configuration so that their encoding and decoding circuits resemble each other. However, a partial matrix which resembles the partial matrix M04 is not present in the expanded part because the check bits C0 to C3 co-exist with data bits in the same block. The part marked with an asterisk (*) of the partial matrices, M01 and M11 and M03 and M13, represents a check bit and data bit, respectively, thus preventing the similarity of the encoding and decoding circuits and making the configuration of these circuits more complex.

In the method described above in (3), there is no similarity between the parity matrix of 4-byte data length (n=40, K=32) and these parity matrix of 8-byte data length (n=72, K=64). Further, it is impossible to construct a parity matrix of 2-byte data length (n=22, K=16) by shortening the parity matrix of the data length of 8 bytes while maintaining b=4.

If it is possible to construct encoding and decoding circuits using the common general-purpose encoding and decoding LSI for each of the storage devices of 2-byte data length, the storage device of 4-byte data length, and the storage device of the 8-byte data length, it is evidently possible to realize a method for correcting and detecting errors using the SEC-DED-SbED code at low cost owing to the mass production and reduction of the parts control processes that are enabled by the above LSI.

SUMMARY OF THE INVENTION

An object of the present invention is to provide a method for correcting and detecting errors using the SEC-DED-SbED code which enables the expandability of coded data and construction of the encoding and decoding circuits for information having different data length by using a general-purpose encoding and deconding LSI. Another object of the present invention is to provide a method for correcting and detecting errors, which method has a high capability to detect the multi-bit errors which occur in a block wider than the b-bit block.

The above objects are accomplished according to the present invention by providing a method for correcting and detecting errors caused in a unit of information which consists of a plurality of blocks, each block being made up of (b) bits. This method involves: generating check bits from the unit of information on the basis of a parity matrix which consists of a plurality of partial matrices, each partial matrix including a b×b matrix Xq (q=1 to b) which is obtained by rotating each two of a b×b matrix $$\begin{bmatrix} 1 & 1 & 1 & \cdots & 1 \\ & 1 & & & \\ & & 1 & & \\ & & & \ddots & \\ & & & & 1 \end{bmatrix}$$

along the column direction by a number (q) and each partial matrix being acted upon for each corresponding block; generating a syndrome from the unit of information and the check bits on the basis of the parity matrix; decoding the generated syndrome on the basis of the parity matrix to indicate an error bit position of the unit of information; correcting an error from the unit of information and the error bit position thereof to provide a unit of information free from correctable error; and detecting an uncorrectable error by decoding the generated syndrome on the basis of the parity matrix.

Further, according to the present invention, the above information is coded based on the parity matrix by arranging the partial matrices which include the above matrix Xq having an equal number of cyclically-displaced bits (q) continuously and thus constituting the above parity matrix in order to enhance the capability for detecting the multi-bit errors which occur in a block wider than the b-bit block.

BRIEF DESCRIPTION OF THE DRAWINGS

In the accompanying drawings;

FIGS. 8 and 9 show an embodiment of the coding and decoding circuits to realize the method for correcting and detecting errors according to the present invention in case of the data length of 2 bytes; FIG. 8 shows an embodiment of the coding circuit and FIG. 9 shows an embodiment of the decoding circuit, respectively;

FIGS. 10, 11, 12, and 13 show an embodiment of the coding and decoding circuits to realize the method for correcting and detecting errors according to the present invention in the case of the data length of 4 bytes.

DETAILED DESCRIPTION OF PREFERRED EMBODIMENTS

The embodiments of the present invention are described below with reference to the drawings.

Figure 1A:
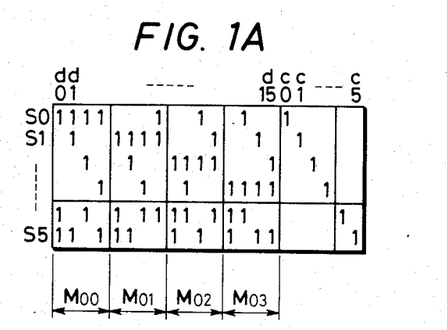
FIGS. 1A and 1B show an example of the parity matrix used in the method for correcting and detecting errors in accordance with the present invention, respectively.
Figure 1B:
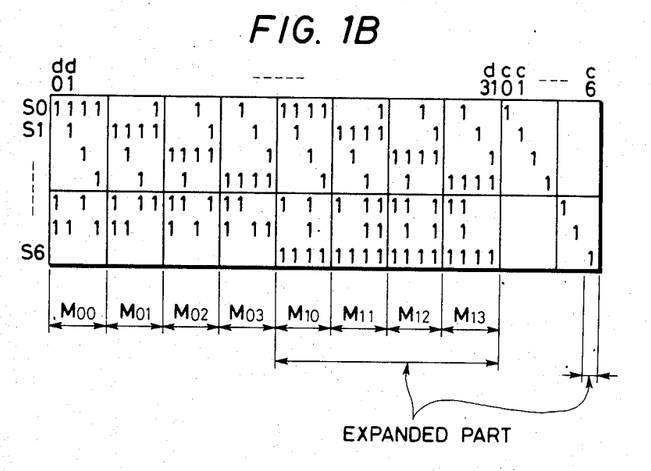

FIGS. 1A and 1B show an embodiment of the parity matrix used in the method for correcting and detecting errors according to the present invention, respectively. FIG. 1A shows an example of the parity matrix of the 2-byte data length of b=4 (n=22, K=16), and FIG. 1B shows an example of the parity matrix for the 4-byte data length of b=4 (n=39, K=32) obtained by expanding the coded data length in FIG. 1A. In these drawings, S0 to S6 denote syndrome, C0 to C6 denote check bits, d0 to d31 denote data bits, and Mij denotes partial matrix.

The parity matrix shown in FIG. 1A consists of only column vectors each of which has a different weight according to an odd number discipline to meet the SEC-DED conditions.

Also, S0 to S3 rows of each of the partial matrices M00 to M03 consist of any of the matrices $$X1 = \begin{pmatrix} 1 & 1 & 1 & 1 \\ & & & 1 \\ & & 1 & \\ & 1 & & \end{pmatrix}, X2 = \begin{pmatrix} & & & 1 \\ 1 & 1 & 1 & 1 \\ & & 1 & \\ & 1 & & \end{pmatrix}$$

$$X3 = \begin{pmatrix} & 1 & & \\ & & 1 & \\ & & & 1 \\ 1 & 1 & 1 & 1 \end{pmatrix}, X4 = \begin{pmatrix} 1 & 1 & 1 & 1 \\ & 1 & & \\ & & 1 & \\ & & & 1 \end{pmatrix}$$

These matrixes X1, X2, X3 and X4 are obtained by cyclically replacing each row of the 4×4 matrix $$\begin{pmatrix} 1 & 1 & 1 & 1 \\ & 1 & & \\ & & 1 & \\ & & & 1 \end{pmatrix}$$

along the column direction by 1 to 4 bits. This is to satisfy the SbED condition by including such matrix Xq that has the following conditions:

(1) weight in each column vector of Xq is 1 or 2
(2) weight of Xq·E0 is 3 or more
(3) weight of Xq·Ee is of any value except 0 in each partial matrix which corresponds to the above block when a b×b matrix is Xq, the error pattern consisting of errors of an odd number bits of 3 or more in the b bit block is E0, and an error pattern consisting of errors of even number bits of 4 or more is Ee.

The parity matrix in FIG. 1B is obtained by expanding the parity matrix in FIG. 1A by specifying the S6 row of the partial matrix M0j as 0 and the S6 row of the partial matrix M1j is 1 and by reversing the S5 row to maintain the condition for the odd number weight column.

Accordingly, the partial matrices, M0j and M1j, have a similar configuration and similar coding and decoding circuits.

Figure 2A:
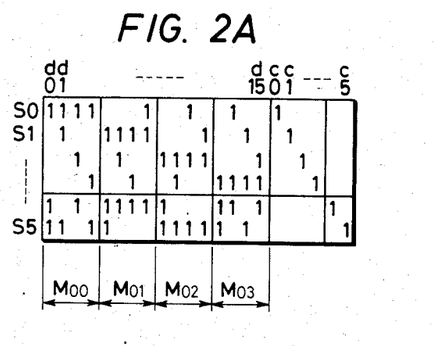
FIGS. 2A and 2B show another example of the parity matrix used in the method for correcting and detecting errors in accordance with the present invention, respectively.
Figure 2B:
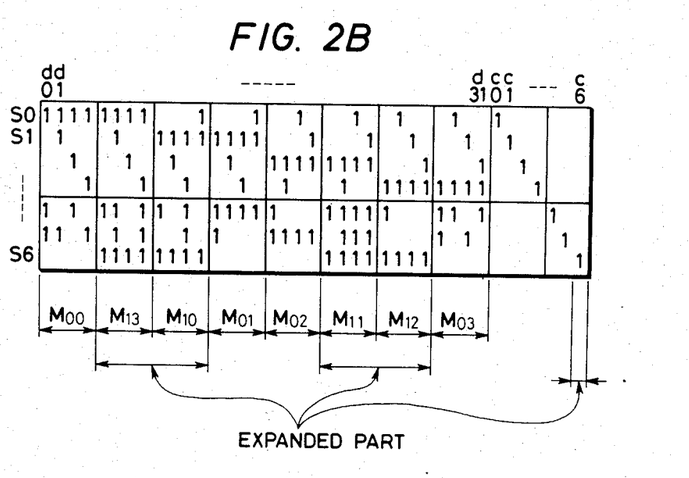

FIGS. 2A and 2B show another embodiment of the parity matrix used in the method for correcting and detecting errors according to the present invention, respectively.

The basic configuration of the parity matrix in FIG. 2A is the same as that in FIG. 1A, that is, an example of 2-byte data length of b=4 (n=22, K=16).

The parity matrix in FIG. 2B is an example of a 4-byte data length of b=4 (n=39, K=32). The extended partial matrices M10 to M13 are arranged in such a manner that they are squeezed into the partial matrices M00 to M03, while they are arranged after the partial matrices M00 to M03 in FIG. 1B. This is to increase the capability to detect multi-bit errors which occur in a wider range than a 4-bit block, for example, the range extending over two continuous blocks, by continuously arranging the partial matrices including the matrices which have an equal number of rotated bits among the above rotated matrices X1 to X4.

In FIG. 2B, the partial matrix including the matrix X4 is first arranged, and the partial matrices including the above matrices are arranged in the order of the matrices X1 to X3.

Generally, an even number bit multi-bit error can be detected excepting when all the syndromes are 0 in the method for correcting and detecting errors using the SEC-DED or the SED-DED-SbED codes, which has a high capability to detect errors. However, an odd number bit multi-bit error can be detected only when the syndrome is not a column vector of the parity matrix, resulting in a low capability to detect errors.

The parity matrix used in the present invention is characterized in that the weight of each column vector of the above matrix Xq is 1 or 2. Therefore, an odd number bit multi-bit error can be detected when the weight of the partial syndrome column corresponding to the above matrix Xq, i.e. S0 to S3 in this drawing, is 3 or more, among the syndrome columns generated when an odd number multi-bit error occurs. The parity matrix in this drawing is given in such a manner that there is one row containing all 1 and the other three rows are in the form of the unit matrix in S0 to S3 in the 8-bit block. Consequently, when an odd number bit multi-bit errors occurs in the above 8-bit block, the syndrome in the row containing all 1 always indicates 1 and there is a great possibility that the syndrome in at least two rows among the other three rows indicates 1. As a result, the capability to detect the multi-bit error which occurs in the above range is improved.

The multi-bit error detection rate in the 8-bit block when the parity matrices in FIGS. 14B, 1B, and 2B are used respectively is as follows:

(1) 66.8% when the parity matrix in FIG. 14B is used
(2) 66.8% when the parity matrix in FIG. 1B is used
(3) 74.2% when the parity matrix in FIG. 2B is used.

The following description is made by using the parity matrix in FIG. 2A or FIG. 2B.

Figure 3:
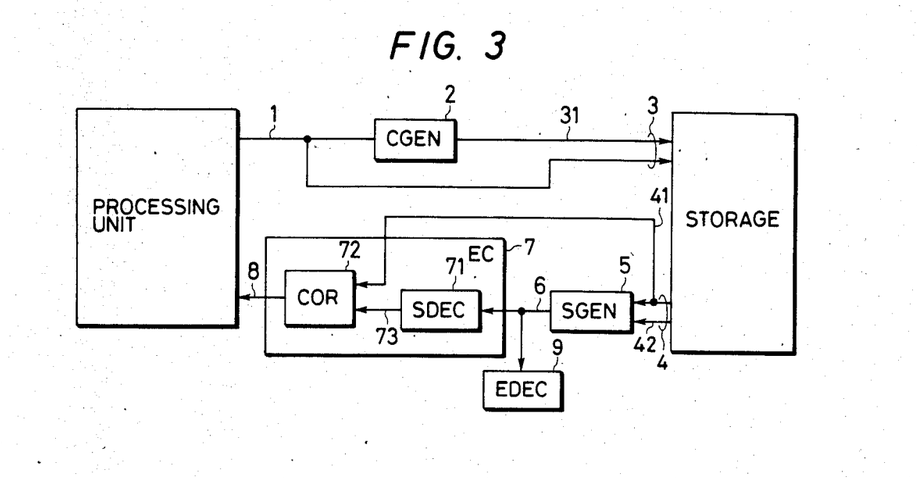
FIG. 3 shows an example of logic block for coding and decoding circuits which uses the method for correcting and detecting errors in accordance with the present invention.

FIG. 3 is a logic block diagram which shows an embodiment of the coding and decoding circuits to realize the method for correcting and detecting errors according to the present invention. In the drawing, 2 denotes a check bit generation circuit (hereinafter referred to as CGEN) as an encoding circuit, 5 and 7 denote a syndrome generation circuit (hereinafter referred to as SGEN) and an error correction circuit (hereinafter referred to as EC), respectively, as decoding circuits, and 9 denotes an error decision circuit (hereinafter referred to as EDEC). EC 7 consists of a syndrome decoding circuit 71 (hereinafter referred to as SDEC) and a correction circuit 72 (hereinafter referring to as COR). 1 denotes information to be encoded, 3 denotes an encoded writing information consisting of the encoded information 1 and a check bit 31, 4 denotes read out encoded information consisting of information 41 to be decoded and a check bit 42, 6 denotes a syndrome, 73 denotes a signal indicating error bit position, and 8 denotes decoded information.

The operation is described below with reference with this drawing. When writing information, the information 1 sent from a processor unit is formed into the encoded writing information 3 by adding the check bits 31 which are generated on the basis of the parity matrix in FIG. 2A or FIG. 2B by the CGEN 2, and the information 3 is written in a storage. Next, when reading out the information, the encoded information 4 is read out from the storage. This read out information 4 may contain an error during an interval from the above writing to the above reading. The read out information 4 is inputted into the SGEN 5 and the information 41 is inputted into the COR 72. In the SGEN 5, syndrome 6 is generated based on the above parity matrix. The generated syndrome 6 is inputted into the SDEC 71 and the EDEC 9. In the SDEC, the syndrome 6 is decoded based on the above parity matrix, and the signal indicating error bit position 73 is generated when there is a correctable error in the information 41 to be decoded. The above signal indicating error bit position 73 is inputted into the COR 72, in which the error in the above information 41 is corrected and the decoded information 8 is sent to the processing unit. When the signal indicating error bit position 73 is not inputted, no correction is made and the information 41 becomes the decoded information 8 as it is. On the other hand, in the EDEC 9, the above syndrome 6 is decoded on the basis of the above parity matrix to decide whether there is a correctable error or an uncorrectable error in the above read out encoded information 4.

Figure 4:
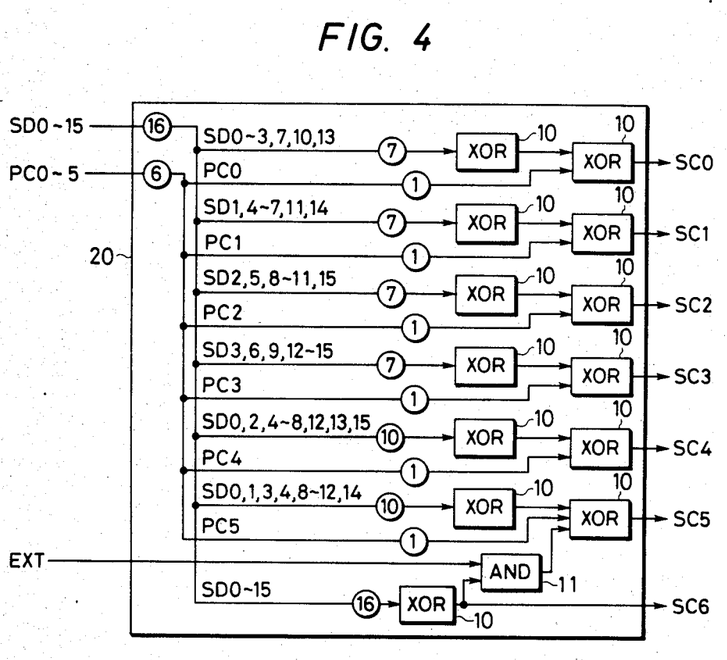
FIGS. 4, 5, 6, and 7 show an example of each logic block in the LSI constituting the coding and decoding circuits shown in FIG. 3, respectively.
Figure 5:
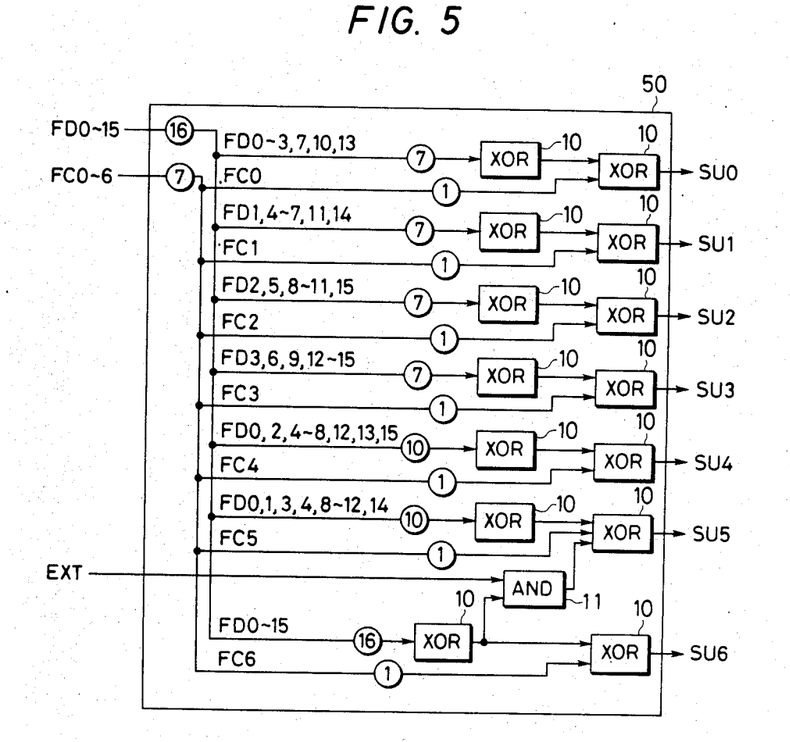
Figure 6:
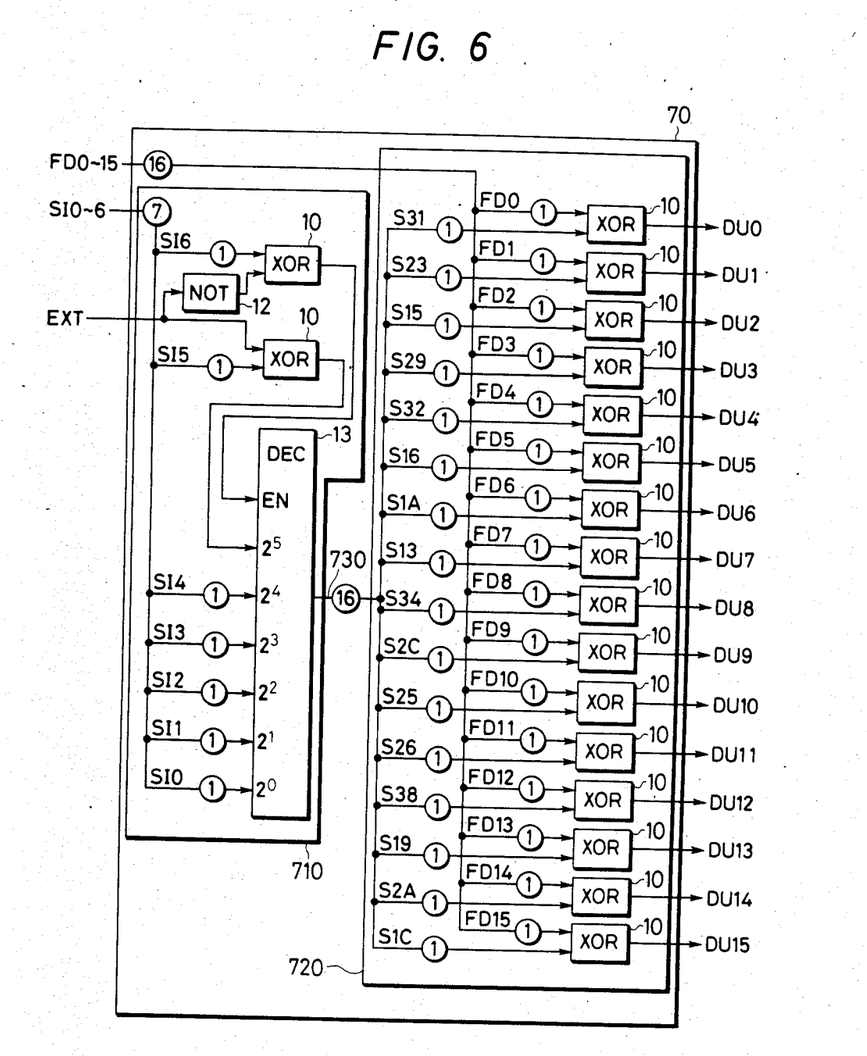
Figure 7:
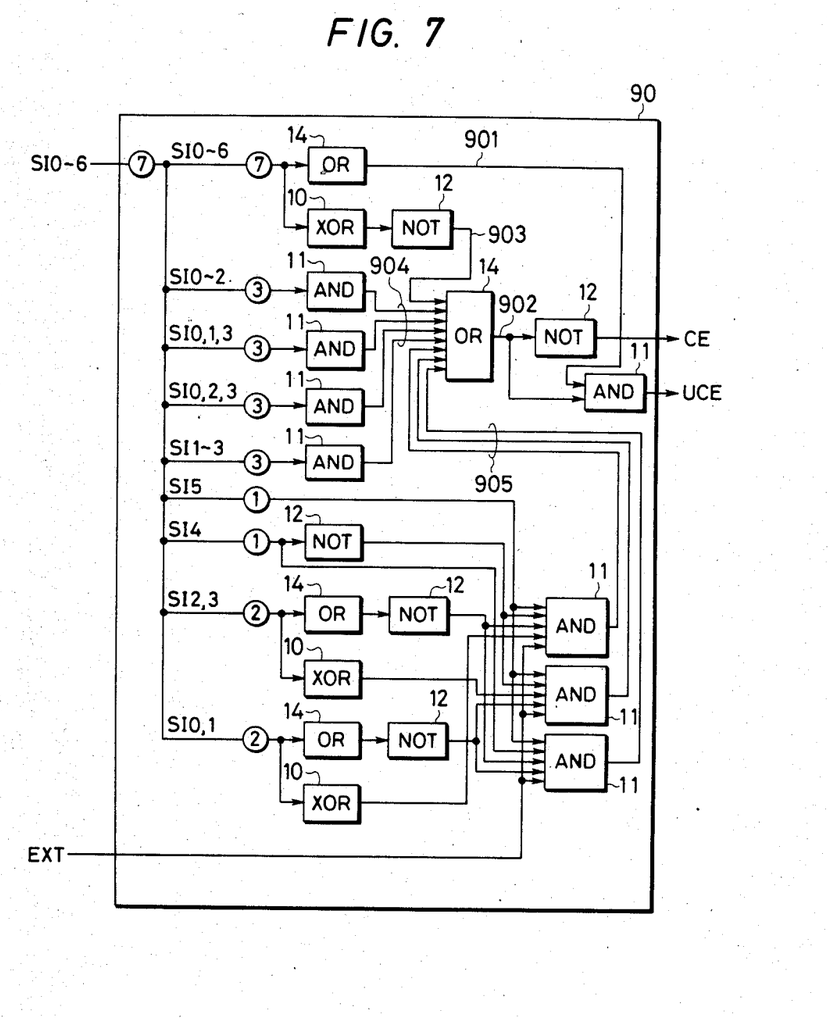

FIGS. 4 through 7 show an embodiment of each logic block in the LSI which constitutes the encoding and decoding circuits, respectively. FIG. 4 shows the CGEN block 20 constituting the CGEN 2, FIG. 5 shows the SGEN block 50 constituting the SGEN 5, FIG. 6 shows the EC block 70 constituting the EC 7, and FIG. 7 shows the EDEC block 90 constituting the EDEC 9. In these drawings, 10 denotes an EXCLUSIVE OR gate, 11 denotes an AND gate, 12 denotes a NOT gate, 13 denotes a decoder, and 14 denotes an OR gate. SD0 to SD15, PC0 to PC5, EXT, SC0 to SC6, FD0 to FD15, FC0 to FC6, SU0 to SU6, SI0 to SI6, DU0 to DU15, CE, and UCE represents the input and output signal pins of the LSI, and the figures in parentheses show the number of signals.

In the CGEN block 20 in FIG. 4, the check bits generated in accordance with the parity matrix in FIG. 2A are outputted to the SC0 to SC5 pins for the data inputted to the SD0 to SD15 pins. The EXCLUSIVE OR result of all of the above input data is outputted to the SC6 pin. When 1 is inputted to the EXT pin, the check bits generated according to the row matrix obtained by reversing the data bit row in S5 of the above parity matrix are outputted to the SC5 pin. When the inputs are applied to the PC0 to PC5 pins, the EXCLUSIVE OR Signals of the check bits generated according to the above parity matrix and the above inputs are outputted to the SC0 to SC5 pins.

In the SGEN block 50 shown in FIG. 5, the syndrome generated according to the above parity matrix is outputted to the SU0 to SU5 pins for the data inputted to the FD0 to FD15 pins and the check bits inputted to the FC0 to FC5 pins. The EXCLUSIVE OR result of all the above inputted data and the signal inputted to the FC6 pin is outputted to the SU6 pin. When 1 is inputted to the EXT pin, the syndrome generated according to the row matrix obtained by reversing the data bit row in the S5 row of the above parity matrix is outputted to the SU5 pin.

The EC block 70 shown in FIG. 6 consists of the SDEC block 710 constituting the SDEC 71, the COR block 720 constituting the COR 72, and the position indicating signal 730 constituting the signal indicating error bit position 73. The SDEC block 710 decodes the syndrome inputted through the SI0 to SI6 pins using the decoder 13. At this time, the decoder 13 becomes effective for operation only when the EXT pin input is 0 and the SI6 pin input is 0, and the EXT pin input is 1 and the SI6 pin input is 1. Also, the SI5 pin input is inputted as it is to the $2^5$ input of the decoder 13 when the EXT pin input is 0, and the SI5 pin input is inputted after being reversed to the $2^5$ input of the decoder 13 when the EXT pin input is 1. The SI0 to SI4 pin input is inputted to the $2^0$ to $2^4$ input of the decoder 13. When both the EXT pin input and the SI6 pin input are 0 and the syndrome 0 to 5 inputted to the SI0 to SI5 pin is equal to each column vector of data bits in the above parity matrix, the position indicating signal 730 which corresponds to the above column vector is outputted. When both the EXT pin input and the SI6 pin input are 1 and the above syndrome 0 to 5 is equal to each column vector of the data bits in the parity matrix obtained by reversing the S5 data bit row in the above parity matrix, the position indicating signal 730 which corresponds to the above column vector is outputted. In the drawing, the symbol Sij which distinguishes 16 signals of the position indicating signal 730 represents the position indicating signal 730 outputted from the above decoder 13 when the value of the $2^5$ to $2^0$ input of the decoder 13 is displayed in 16 base and ij. In the COR block 720, the data inputted through the FD0 to FD15 pins is corrected by the corresponding position indicating signal 730. Namely, only when the corresponding position indicating signal 730 is 1, the above data is reversed, and the other data is outputted to the DU0 to DU15 pins as it is.

The EDEC block 90 shown in FIG. 7 determines if the error is a correctable error or an uncorrectable error based on the syndrome value inputted to the SI0 to SI6 pins according to the parity matrix shown in FIGS. 2A or 2B.

Generally, in the method for correcting and detecting errors using the SEC-DED or the SEC-DED-SbED codes, an error is determined to be a correctable error when the syndrome is equal to any one of the column vectors of the parity matrix and to be an uncorrectable error when the syndrome is not all 0 and not equal to any of the above column vectors. In the parity matrix in FIG. 2A, the syndrome is determined to be unequal to any of the column vectors based on any of the following conditions:

(1) the weight is an even number
(2) the weight of S0 to S3 is 3 or more.

In the parity matrix in FIG. 2B, the syndrome is also determined to be unequal when
(3) the S5 to S0 values are displayed in 16 base and any of 21, 22, 24, 28, and 30 in addition to the above conditions (1) and (2). In FIG. 7, the signal 903 represents the above condition (1), the signal 904 represents condition (2), and the signal 905 represents condition (3). However, the signal 905 is effective only when the EXT pin input is 1. Accordingly, the OR output signal 902 of the signal 902, 904, 905 show that the above input syndrome value is unequal to any one of the column vectors of the parity matrix in FIG. 2A when the EXT pin input is 0 and of the parity matrix in FIG. 2B when the EXT pin input is 1. The above signal 902 is outputted to the CE pin which indicates a correctable error after being reversed, and to the UCE pin which indicates an uncorrectable error after being ANDed with the signal 901 which shows that the above syndrome is not all 0.

Next, an embodiment is described below wherein the encoding and decoding circuits shown in FIG. 3 are realized by using an LSI having each logic block shown in FIGS. 4 through 7.

Figure 8:
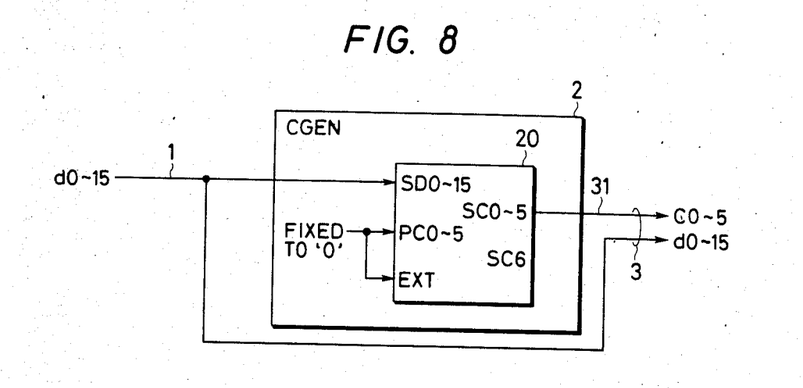
Figure 9:
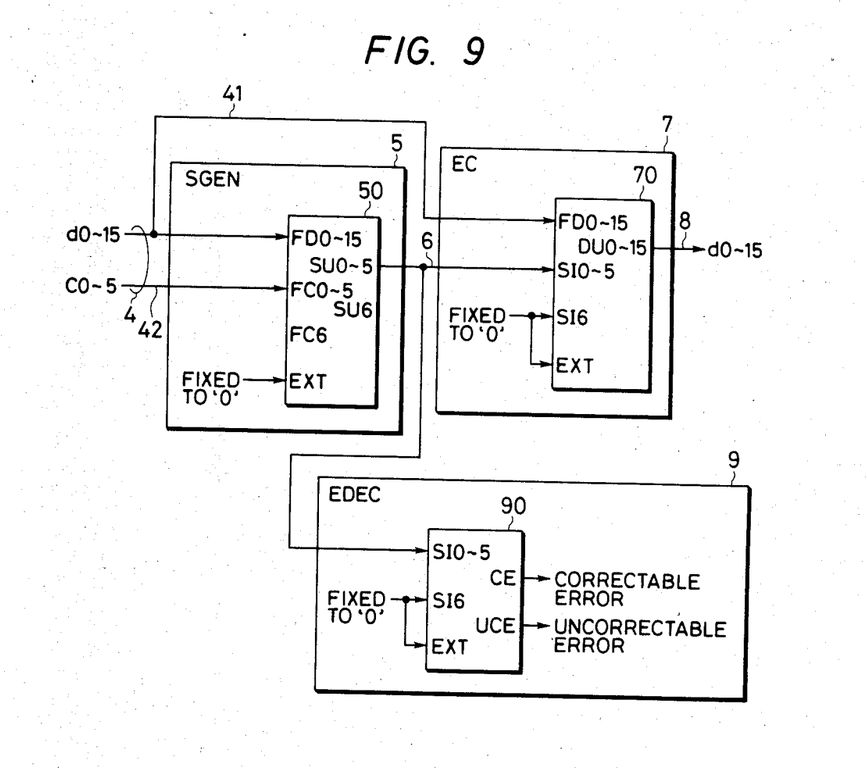

FIGS. 8 and 9 show block diagrams of the circuits which perform the method for correcting and detecting errors having the 2-byte data length using the parity matrix in FIG. 2A. FIG. 8 represents the block diagram of the encoding circuit, and FIG. 9 represents the block diagram of the decoding circuit.

In FIG. 8, the CGEN 2 consists of the CGEN block 20. In this drawing, d0 to d15 denote data bits, and C0 to C5 denote check bits. The input fixed to '0' is applied to the PC0 to PC5 pins and the EXT pin in the CGEN block 20. When the information 1 to be encoded is inputted to the SD0 to SD15 pins, the check bit 31 of the encoded writing information 3 is outputted to the SC0 to SC5 pins.

In FIG. 9, the SGEN5, the EC 7, and the EDEC 9 consist of the SGEN block 50, the EC block 70, and the EDEC block 90, respectively. Also, the input fixed to '0' is applied to the EXT pin and the SI6 pin in each block. When the read out encoded information 4 is inputted to the FD0 to FD15 pins and the FC0 to FC5 pins in the SGEN block 50, the syndrome 6 is outputted to the SU0 to SU5 pins. When the information 41 to be decoded and the syndrome 6 are inputted to the FD0 to FD15 pins and the SI0 to SI5 pins in the EC block, respectively, the decoded information 8 is outputted to the DU0 to DU15 pins. When the syndrome 6 is inputted to the SI0 to SI5 pins in the EDEC block 90, a signal indicating a correctable error is outputted to the CE pin or a signal indicating an uncorrectable error is outputted to the UCE pin, if there is an error in the read out encoded information 4.

Figure 10:
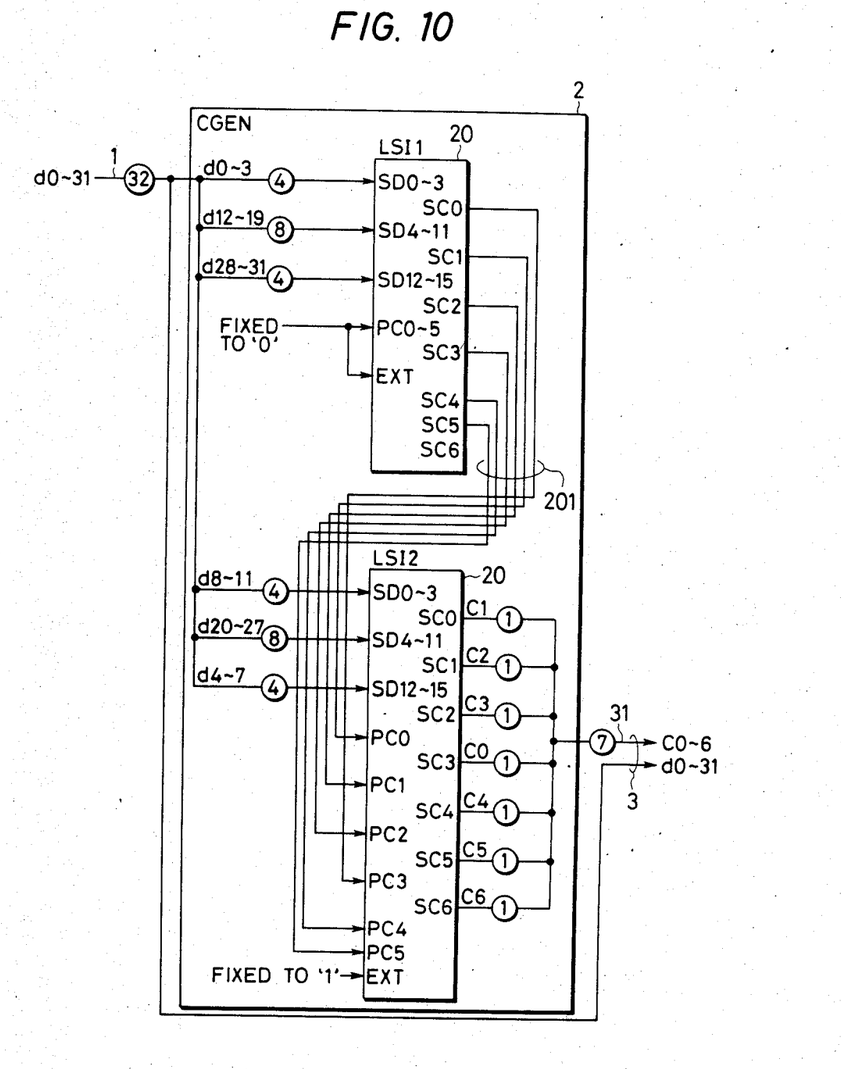
FIG. 10 shows an embodiment of the syndrome generation circuit for coding.
Figure 11:
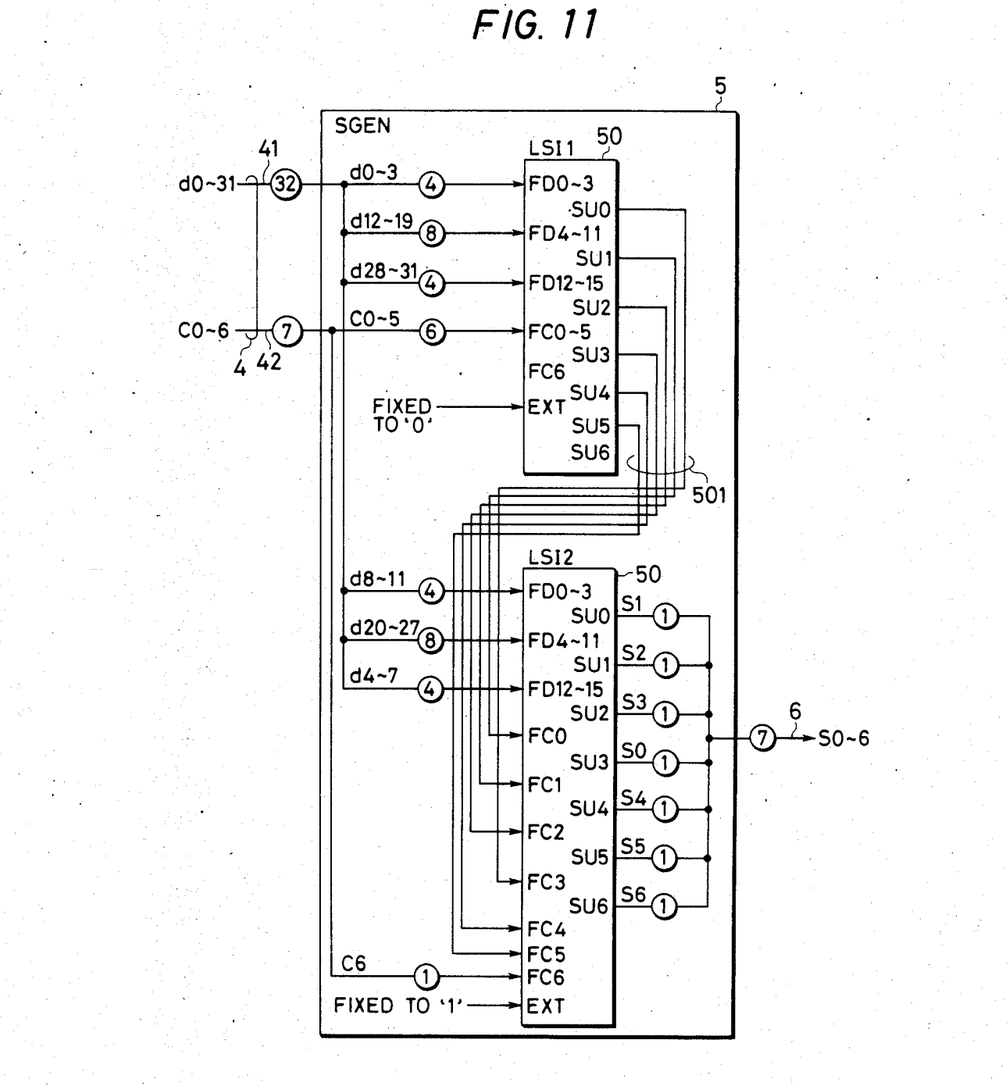
FIG. 11 shows an embodiment of the syndrome generation circuit for decoding.
Figure 12:
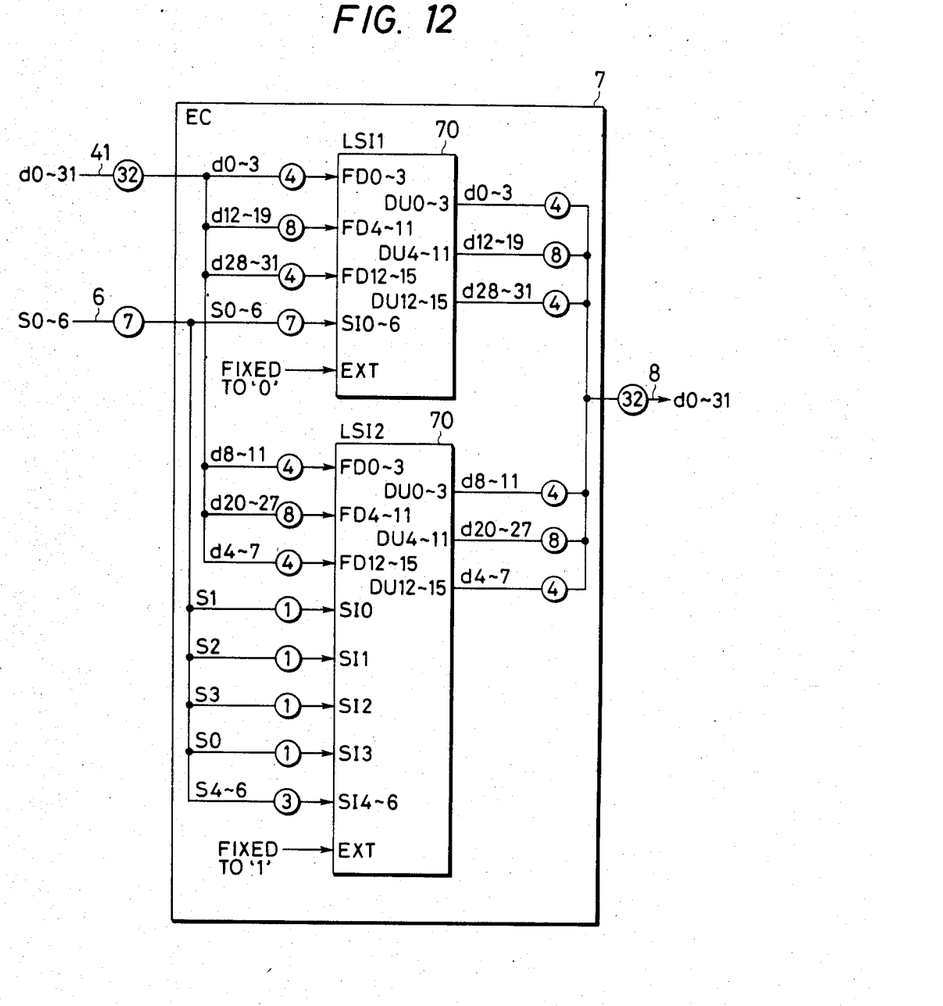
FIG. 12 shows an embodiment of the error correction circuit for decoding.
Figure 13:
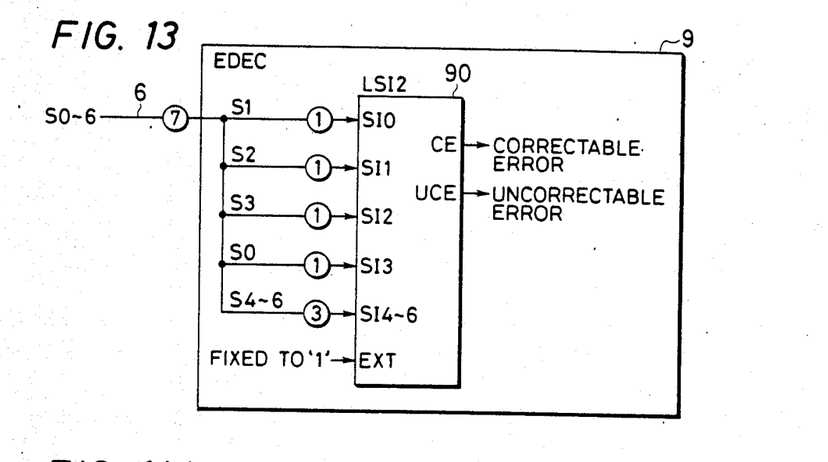
FIG. 13 shows an embodiment of the error decision circuit.

FIGS. 10 through 13 show block diagrams of the circuits which realize the method for correcting and detecting the errors having the data length of 4 bytes using the parity matrix in FIG. 2B. FIGS. 10 and 11 show the block diagrams of the check bit generation and syndrome generation circuits for encoding and decoding, respectively, FIG. 12 shows the block diagram of the error correction circuit for decoding, and FIG. 13 shows the block diagram of the error decision circuit. In these drawings, d0 to d31 denote data bits, C0 to C6 denote check bits, S0 to S6 denote a syndrome, and the figures in the parentheses show the number of signals. The LSI1 and LSI2 indicate a distinction between the two LSIs having each logic block shown in FIGS. 4 through 7.

In FIG. 10, the CGEN 2 consists of the CGEN block 20 in the LSI1 and LSI2. The input fixed to '0' is applied to the PC0 to PC5 pins and the EXT pin of the LSI1, and the input fixed to '1' is applied to the EXT pin of the LSI2. When the bits shown in the drawing (16 signals in total) are inputted to the SD0 to SD15 pins of the LSI1 among the information 1 to be encoded, the check bit 201 generated according to the partial matrix equal to the partial matrix Moj of the above parity matrix is outputted to the SC0 to SC5 pins. When the remaining bits shown in the drawing (16 signals in total) are inputted to the SD0 to SD15 pins of the LSI2 among the information 1 to be encoded and the above check bit 201 is inputted to the PC0 to PC5 pins, the check bit 31 in the encoded writing information 3 is outputted to the SC0 to SC6 pins.

In FIG. 11, the SGEN 5 consists of the SGEN block 50 of the LSI1 and the LSI2. The input fixed to '0' and the input fixed to '1' are applied to the EXT pins of the LSI1 and the LSI2, respectively. When the bits shown in the drawing (22 signals in total) are inputted to the FD0 to FD15 pins and the FC0 to FC5 pins of the LSI1 among the read out encoded information 4, the syndrome 501 generated according to the partial matrix equal to the partial matrix Moj of the above parity matrix is outputted to the SU0 to SU5 pins. When the remaining bits shown in the drawing (17 signals in total) are inputted to the FD0 to FD15 pins and the FC6 pin of the LSI2 among the read out encoded information 4 and the above syndrome 501 is inputted to the FC0 to FC5 pins, the syndrome 6 is outputted to the SU0 to SU6 pins.

In FIG. 12, the EC 7 consists of the EC block 70 of the LSI1 and the LSI2. The input fixed to '0' and the input fixed to '1' are applied to the EXT pins of the LSI1 and the LSI2, respectively. When the information 41 to be decoded and the syndrome 6 generated in FIG. 11 are inputted to the FD0 to FD15 pins of each LSI and the SI0 to SI6 pins, respectively, the decoded information 8 is outputted to the DU0 to DU15 pins.

In FIG. 13, the EDEC 9 consists of the EDEC block 90 of the LSI2. The EDEC block of the LSI1 is not used. The input fixed to '1' is applied to the EXT pin of the LSI2. When the syndrome 6 generated in FIG. 11 is inputted to the SI0 to SI6 pins as shown in the drawing, a signal indicating a correctable error is outputted to the CE pin or a signal indicating an uncorrectable error is outputted to the UCE pin, if there is an error in the read out encoded information 4 shown in FIG. 11.

The embodiments of the method for correcting and detecting errors using the parity matrices in FIGS. 2A and 2B are described above. It is evident that the above method can also be constructed by using the parity matrices in FIGS. 1A and 1B.

Since the SbED conditions described in FIGS. 1A and 1B are effective in each partial matrix Mij of the parity matrices in FIGS. 1A and 1B or 2A and 2B, though the column vector in the above partial matrix is displaced, it is evident that the method for correcting and detecting errors according to the present invention can be constructed even when the above parity matrix is used after transforming it by the above means and when the above parity matrix is used after transforming it by displacing the row vector of the matrix consisting of the above whole partial matrix Mij.

The above explanations are given in case of b=4 and 2- and 4-bytes data length. It goes without saying that they can be selected arbitrarily.

According to the present invention, it is possible to realize the method for correcting and detecting errors using the SECDED-SbED code enabling the expandability of coded data wherein the encoding and decoding circuits for the information having different data length can be constructed using general-purpose encoding and decoding LSIs, resulting in the improvement of the reliability of equipment at a low cost.

It is also possible to realize the above method for correcting and detecting errors which has high capability of detecting a multi-bit error occurring in a wider block than the b bit block, providing the effect to further improve the reliability of the equipment.

What is claimed is:

1. A method for correcting and detecting error caused in a unit of information which consists of plurality of blocks each block being made up of (b) bits, said method comprising the steps of:

generating check bits from said unit of information on the basis of a parity matrix which consists of a plurality of partial matrices, each partial matrix including a b×b matrix Xq (q=1 to b) which is obtained by rotating each row of a b×b matrix $$\begin{bmatrix} 1 & 1 & 1 & \ldots & 1 \\ & 1 & & & \\ & & 1 & & \\ & & & \cdot & \\ & & & & \cdot \\ & & & & 1 \end{bmatrix}$$

along the column direction by a number (q) and each partial matrix being acted upon for each corresponding block;

generating a syndrome from said unit of information and said check bits on the basis of said parity matrix;

decoding said generated syndrome on the basis of said parity matrix to indicate an error bit position of said unit of information;

correcting an error from said unit of information and said error bit position thereof to complete said unit of information free from correctable error; and detecting an uncorrectable error by decoding said generated syndrome on the basis of said parity matrix.

2. A method for correcting and detecting errors according to claim 1 wherein said partial matrix further includes m×b matrix Vp (p=1 to $2^m$) in which the same column vector appears repeatedly a number b times.

3. A method for correcting and detecting errors according to claim 1 wherein said partial matrix is arranged within said partial matrix in such a manner that the same Xq appears consecutively as many times as the number of b-bit blocks contained in said unit of information divided by b.

4. A method for correcting and detecting errors according to claim 2 wherein said partial matrix is arranged within said parity matrix in such a manner that the same Xq appears consecutively as many times as the number of b-bit blocks contained in said unit of information divided by b.

5. A method for correcting and detecting errors according to claim 1 wherein another parity matrix is formed by replacing one column with another column of said partial matrix of said parity matrix and by repeating the same operation with the same column positions to all of said partial matrix throughout said parity matrix.

6. A method for correcting and detecting errors according to claim 2 wherein another parity matrix is formed by replacing one column with another column of said partial matrix of said parity matrix and by repeating the same operation with the same column positions to all of said partial matrix throughout said parity matrix.

7. A method for correcting and detecting errors according to claim 3 wherein another parity matrix is formed by replacing one column with another column of said partial matrix of said parity matrix and by repeating the same operation with the same column positions to all of said partial matrix throughout said parity matrix.

8. A method for correcting and detecting errors according to claim 4 wherein another parity matrix is formed by replacing one column with another column of said partial matrix of said parity matrix and by repeating the same operation with the same column positions to all of said partial matrix throughout said parity matrix.

9. A method for correcting and detecting errors according to claim 1 wherein another parity matrix is formed by replacing an entire row with another entire row of said parity matrix.

10. A method for correcting and detecting errors according to claim 2 wherein another parity matrix is formed by replacing an entire row with another entire row of said parity matrix.

11. A method for correcting and detecting errors according to claim 3 wherein another parity matrix is formed by replacing an entire row with another entire row of said parity matrix.

12. A method for correcting and detecting errors according to claim 4 wherein another parity matrix is formed by replacing an entire row with another entire row of said parity matrix.

* * * * *